United States Patent
Chen et al.

(10) Patent No.: US 9,893,009 B2
(45) Date of Patent: Feb. 13, 2018

(54) DUPLICATE LAYERING AND ROUTING

(71) Applicant: Taiwan Semiconductor Manufacturing Company Limited, Hsin-Chu (TW)

(72) Inventors: Huang-Yu Chen, Hsinchu County (TW); Chi-Yeh Yu, Hsinchu (TW); Chung-Hsing Wang, Hsinchu County (TW)

(73) Assignee: Taiwan Semiconductor Manufacturing Company Limited (TW)

( * ) Notice: Subject to any disclaimer, the term of this patent is extended or adjusted under 35 U.S.C. 154(b) by 177 days.

(21) Appl. No.: 14/151,999

(22) Filed: Jan. 10, 2014

(65) Prior Publication Data

US 2015/0200159 A1 Jul. 16, 2015

(51) Int. Cl.
*H01L 23/522* (2006.01)
*G06F 17/50* (2006.01)
*H01L 23/528* (2006.01)

(52) U.S. Cl.
CPC ...... *H01L 23/5226* (2013.01); *G06F 17/5077* (2013.01); *G06F 17/5081* (2013.01); *H01L 23/528* (2013.01); *H01L 23/5228* (2013.01); *H01L 23/5283* (2013.01); *H01L 2924/0002* (2013.01)

(58) Field of Classification Search
CPC .......... H01L 23/5226; H01L 23/53219; H01L 23/53228; H01L 23/53233; H01L 23/53238
See application file for complete search history.

(56) References Cited

U.S. PATENT DOCUMENTS

| | | | |
|---|---|---|---|
| 6,605,874 B2 * | 8/2003 | Leu ................. | H01L 21/288 257/758 |
| 2006/0151881 A1 * | 7/2006 | Yamada ............ | H01L 21/6835 257/758 |
| 2010/0071941 A1 * | 3/2010 | Hussein ............ | H01L 21/7682 174/258 |
| 2011/0175193 A1 * | 7/2011 | Nakagawa ........ | H01L 21/76801 257/531 |

(Continued)

*Primary Examiner* — Phat X Cao
(74) *Attorney, Agent, or Firm* — Cooper Legal Group, LLC

(57) ABSTRACT

In some embodiments, a semiconductor arrangement comprises a stacked interconnect structure comprising a first interconnect structure and a second interconnect structure. The stacked interconnect structure has a relatively larger aspect ratio than the first interconnect structure or the second interconnect structure, which reduces resistivity and improves performance. In some embodiments, a duplicate interconnect path is inserted into a design layout for a semiconductor arrangement. The duplicated interconnect path provides an additional path between a first net and a second net connected by an interconnect path. Connecting the first net and the second net by the interconnect path and the duplicated interconnect path reduces resistivity and improves performance. In some embodiments, a semiconductor arrangement comprises cell pin operatively coupled to a duplicate cell pin. The cell pin and the duplicate cell pin are operatively coupled to a logic structure to reduce resistivity and improve performance.

20 Claims, 11 Drawing Sheets

(56) References Cited

U.S. PATENT DOCUMENTS

| | | | |
|---|---|---|---|
| 2011/0233779 A1* | 9/2011 | Wada | B82Y 10/00 257/751 |
| 2012/0217497 A1* | 8/2012 | Shoji | H01L 22/34 257/48 |
| 2014/0202746 A1* | 7/2014 | Anderson | H01L 21/76847 174/255 |
| 2014/0264931 A1* | 9/2014 | Wang | H01L 23/53295 257/774 |

* cited by examiner

DUPLICATE LAYERING AND ROUTING

BACKGROUND

Resistivity of an interconnect structure, such as a wire within a metal (1) layer or a metal (2) layer of a semiconductor arrangement, is based upon geometry of the interconnect structure. A decrease in aspect ratio of the interconnect structure will increase resistivity of the interconnect structure. Increased resistivity of the interconnect structure will negatively affect performance of the semiconductor arrangement, such as speed of an integrated circuit. As semiconductor arrangements become smaller and thus interconnect structures become smaller, resistivity becomes larger, such as about 3.7× increase in resistivity when using 7 nm technology as opposed to 45 nm technology, which will negatively impact performance.

DETAILED DESCRIPTION

Figure 1A:
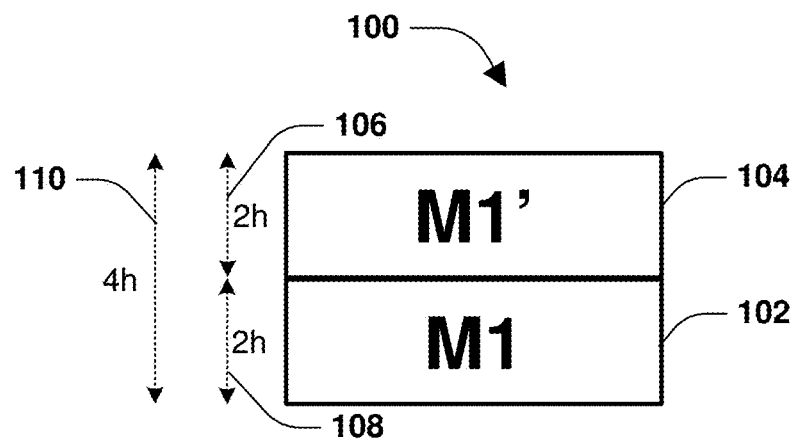
FIG. 1A is an illustration of a semiconductor structure comprising a first stacked interconnect structure, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

In some embodiments, one or more semiconductor arrangements comprising a stacked interconnect structure are provided. A semiconductor arrangement comprises a first connectivity layer, such as a metal (1) layer. A first interconnect structure is formed within a first lower layer of the first connectivity layer. An aspect ratio is increased, which decreases resistivity, by forming a second interconnect structure within a first upper layer of the first connectivity layer. The second interconnect structure is formed over the first interconnect structure to form a first stacked interconnect structure having an increased aspect ratio and thus a decreased resistivity in comparison with the first connectivity layer or the second connectivity layer. The decreased resistivity improves performance of the semiconductor arrangement.

In some embodiments, one or more techniques for routing nets within a design layout for a semiconductor arrangement are provided, such as during a routing stage or a post routing stage of the design layout. A first net connected to a second net by a first interconnect path is identified. A first duplicate interconnect path is inserted into the design layout to connect the first net and the second net. Because the first net is connected to the second net by both the first interconnect path and the second interconnect path, resistivity is decreased, which improves performance of the semiconductor arrangement.

In some embodiments, one or more semiconductor arrangements comprising a duplicate cell pin are provided. A semiconductor arrangement comprises a cell pin that is operatively coupled to a first portion of a logic structure, such as a first gate. A duplicate cell pin is operatively coupled to a second portion of the logic structure, such as a second gate. The duplicate cell pin is operatively coupled to the cell pin to reduce resistivity, such as via resistivity associated with pin access for the logic structure.

Figure 1B:
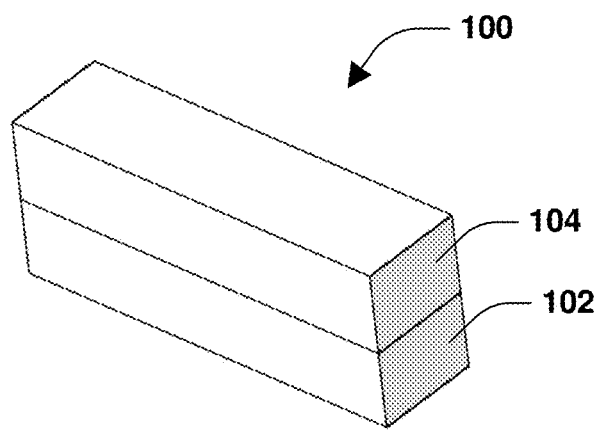
FIG. 1B is an illustration of a perspective view of a semiconductor structure comprising a first stacked interconnect structure, according to some embodiments.

FIG. 1A illustrates a semiconductor structure comprising a first stacked interconnect structure 100. In some embodiments, the first stacked interconnect structure 100 is formed within a first connectivity layer, such as being formed as a wire within a metal (1) layer. The first stacked interconnect structure 100 comprises a first interconnect structure 102 formed within a first lower layer (M1) of the first connectivity layer. A second interconnect structure 104 is formed within a first upper layer (M1') of the first connectivity layer as part of the first stacked interconnect structure 100. Adding the second interconnect structure 104 to the first stacked interconnect structure 100 increases an aspect ratio of the first stacked interconnect structure 100. In some embodiments of increasing the aspect ratio, the first interconnect structure 102 has a height (2h) 108 and the second interconnect structure 104 has a height (2h) 106, resulting in an increased aspect ratio for the first stacked interconnect structure 100 having a height (4h) 110. In some embodiments, the first interconnect structure 102 is formed using a first mask, and the second interconnect structure 104 is formed using the first mask. FIG. 1B illustrates a perspective view of the first stacked interconnect structure 100.

Figure 2A:
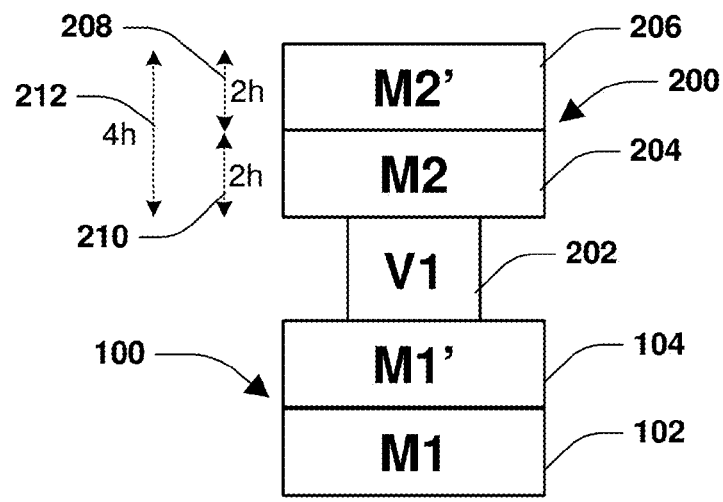
FIG. 2A is an illustration of a semiconductor structure comprising a first stacked interconnect structure and a second stacked interconnect structure, according to some embodiments.
Figure 2B:
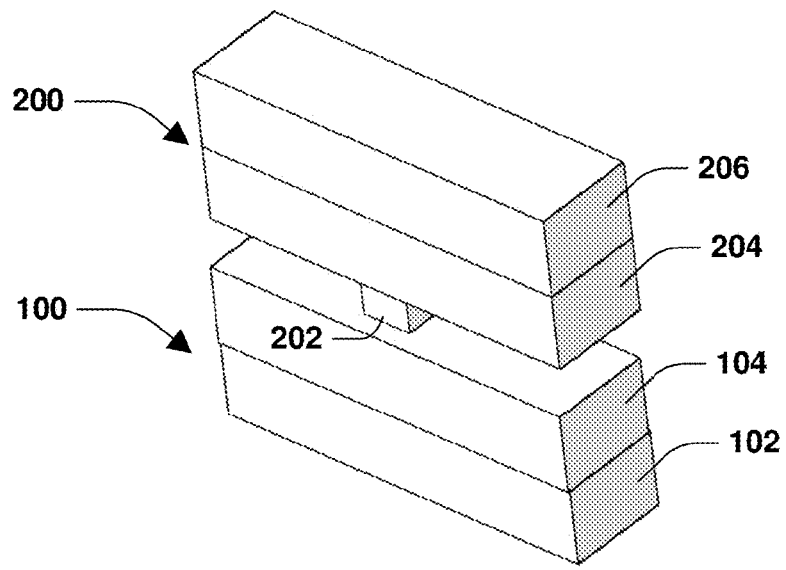
FIG. 2B is an illustration of a perspective view of a semiconductor structure comprising a first stacked interconnect structure and a second stacked interconnect structure, according to some embodiments.

FIG. 2A illustrates a semiconductor arrangement comprising the first stacked interconnect structure 100 and a second stacked interconnect structure 200. In an embodiment, the first stacked interconnect structure 100 is connected to the second stacked interconnect structure 200 by a via 202. The second stacked interconnect structure 200 is formed within a second connectivity layer, such as being formed as a wire within a metal (2) layer. The second stacked interconnect structure 200 comprises a third interconnect structure 204 formed within a second lower layer (M2) of the second connectivity layer. A fourth interconnect structure 206 is formed within a second upper layer (M2') of the second connectivity layer as part of the second stacked interconnect structure 200. Adding the third interconnect structure 206 to the second stacked interconnect structure 200 increases an aspect ratio of the second stacked interconnect structure 200. In some embodiments of increasing the aspect ratio, the third interconnect structure 204 has a height (2h) 210 and the fourth interconnect structure 206 has a height (2h) 208, resulting in an increased aspect ratio for the second stacked interconnect structure 200 having a height (4h) 212. In some embodiments, the third interconnect structure 204 is formed using a second mask, and the fourth interconnect structure 206 is formed using the second mask. FIG. 2B illustrates a perspective view of the first stacked interconnect structure 100 and the second stacked interconnect structure 200.

Figure 3A:
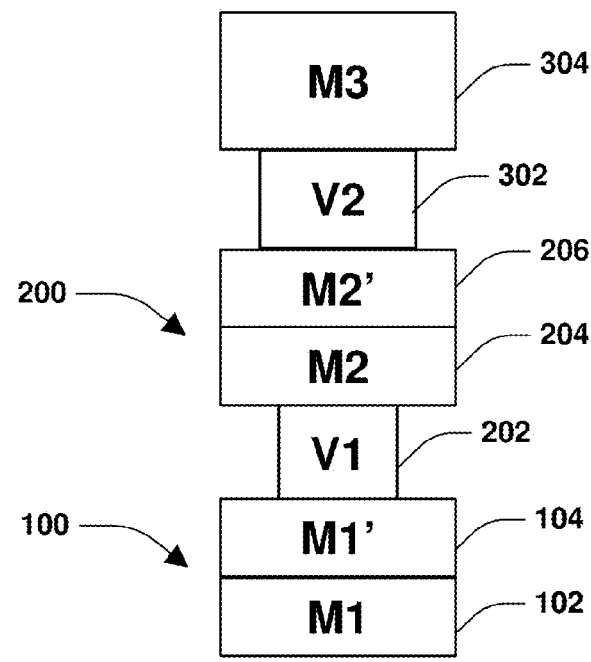
FIG. 3A is an illustration of a semiconductor structure comprising a first stacked interconnect structure, a second stacked interconnect structure, and an interconnect structure, according to some embodiments.
Figure 3B:
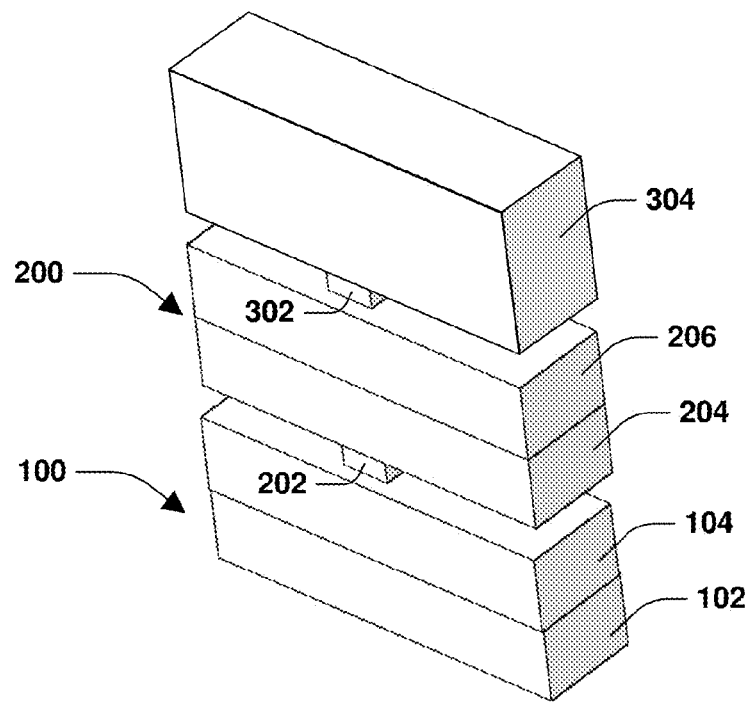
FIG. 3B is an illustration of a perspective view of a semiconductor structure comprising a first stacked interconnect structure, a second stacked interconnect structure, and an interconnect structure, according to some embodiments.

FIG. 3A illustrates a semiconductor arrangement comprising the first stacked interconnect structure 100, the second stacked interconnect structure 200, and an interconnect structure 304. The first stacked interconnect structure 100 comprises the first interconnect structure 102 and the second interconnect structure 104. The second stacked interconnect structure 200 comprises the third interconnect structure 204 and the fourth interconnect structure 206. The first stacked interconnect structure 100 is connected to the second stacked interconnect structure 200 by the via 202. In some embodiments, the via 202 connects the second interconnect structure 104 and the third interconnect structure 204. The interconnect structure 304 is formed within a third connectivity layer of the semiconductor arrangement. In some embodiments, the third connectivity layer corresponds to a metal (3) layer. The metal (3) layer has a relatively lower resistivity or relatively less stringent sizing and spacing constraints, and thus the interconnect structure 304 is formed as a single interconnect structure as opposed to a stacked configuration of the first stacked interconnect structure 100 and the second stacked interconnect structure 200 that are formed in connectivity layers having relatively more stringent sizing and spacing constraints. The second stacked interconnect structure 200 is connected to the interconnect structure 304 by a via 302. FIG. 3B illustrates a perspective view of the first stacked interconnect structure 100, the second stacked interconnect structure 200, and the interconnect structure 304.

Figure 4A:
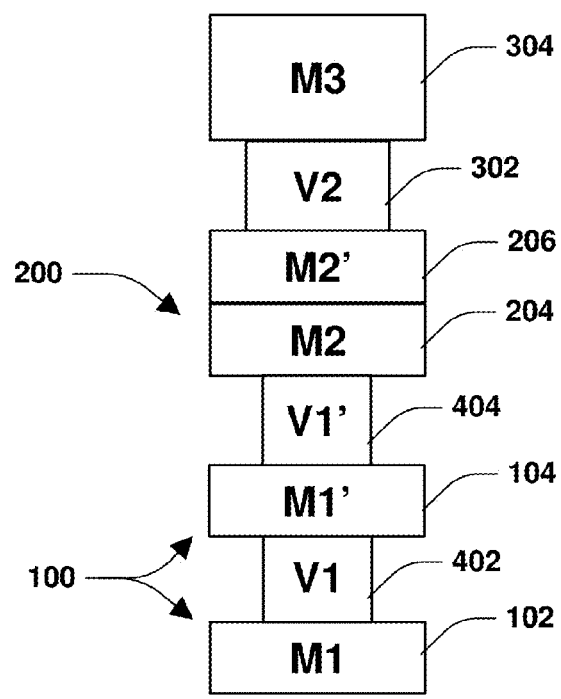
FIG. 4A is an illustration of a semiconductor structure comprising a first stacked interconnect structure, a second stacked interconnect structure, and an interconnect structure, according to some embodiments.
Figure 4B:
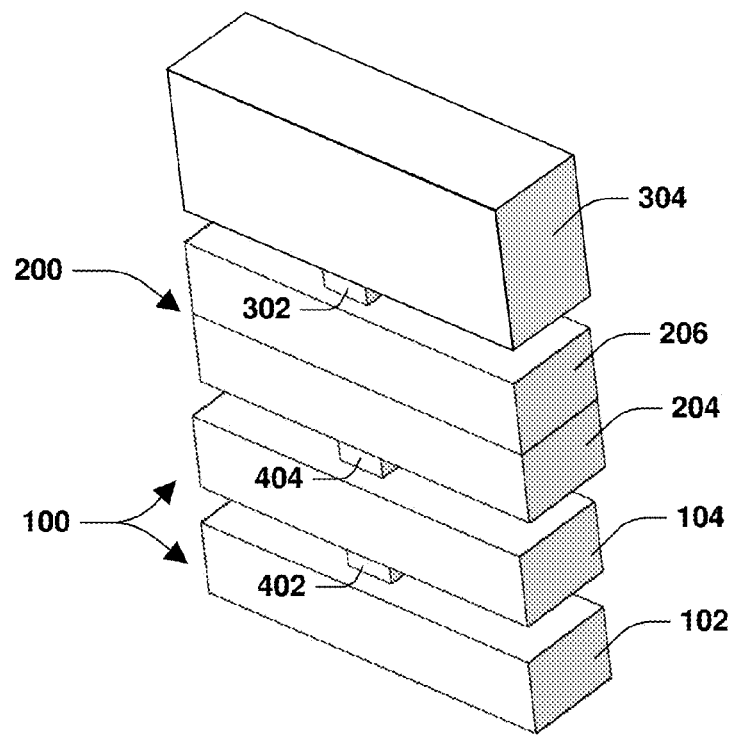
FIG. 4B is an illustration of a perspective view of a semiconductor structure comprising a first stacked interconnect structure, a second stacked interconnect structure, and an interconnect structure, according to some embodiments.

FIG. 4A illustrates a semiconductor arrangement comprising the first stacked interconnect structure 100, the second stacked interconnect structure 200, and the interconnect structure 304. The first stacked interconnect structure 100 comprises the first interconnect structure 102 formed within the first lower layer (M1) of the first connectivity layer. The first stacked interconnect structure 100 comprises the second interconnect structure 104 formed within the first upper layer (M1') of the first connectivity layer. The first interconnect structure 102 is connected to the second interconnect structure 104 by via 402. The first stacked interconnect structure 100 is connected to the second stacked interconnect structure 200 by via 404. The second stacked interconnect structure 200 is connected to the interconnect structure 304 by via 302. FIG. 4B illustrates a perspective view of the first stacked interconnect structure 100, the second stacked interconnect structure 200, and the interconnect structure 304.

Figure 5A:
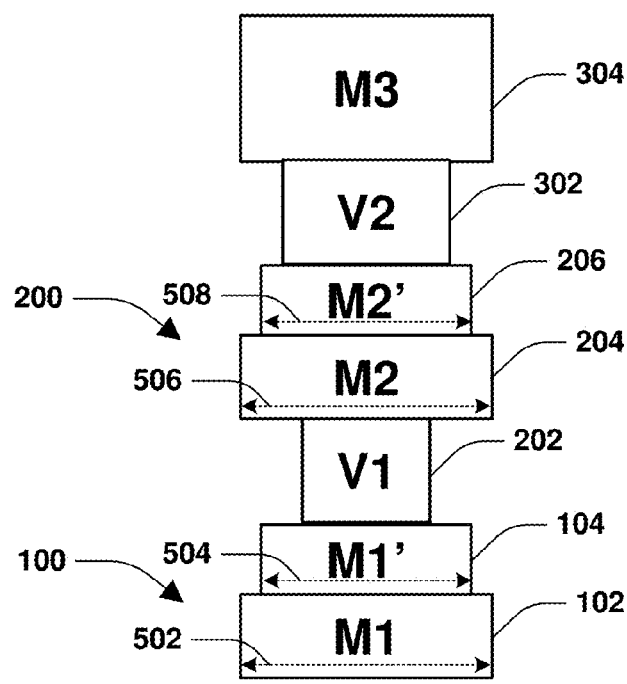
FIG. 5A is an illustration of a semiconductor structure comprising a first stacked interconnect structure, a second stacked interconnect structure, and an interconnect structure, according to some embodiments.

FIG. 5A illustrates a semiconductor arrangement comprising the first stacked interconnect structure 100, the second stacked interconnect structure 200, and the interconnect structure 304. The first stacked interconnect structure 100 comprises the first interconnect structure 102 having a first aspect ratio, such as a first width 502. The first stacked interconnect structure 100 comprises the second interconnect structure 104 having a second aspect ratio, such as a second width 504. In some embodiments, the first aspect ratio is larger than the second aspect ratio, such as the first width 502 being larger than the second width 504, which mitigates defects, such as toppling, to improve yield. In some embodiments, the first interconnect structure 102 is formed to the first aspect ratio using a first mask and a first set of parameters such as doping concentration and type parameters and focusing parameters for light refraction during patterning. The second interconnect structure 104 is formed to the second aspect ratio using the first mask and a second set of parameters different than the first set of parameters.

Figure 5B:
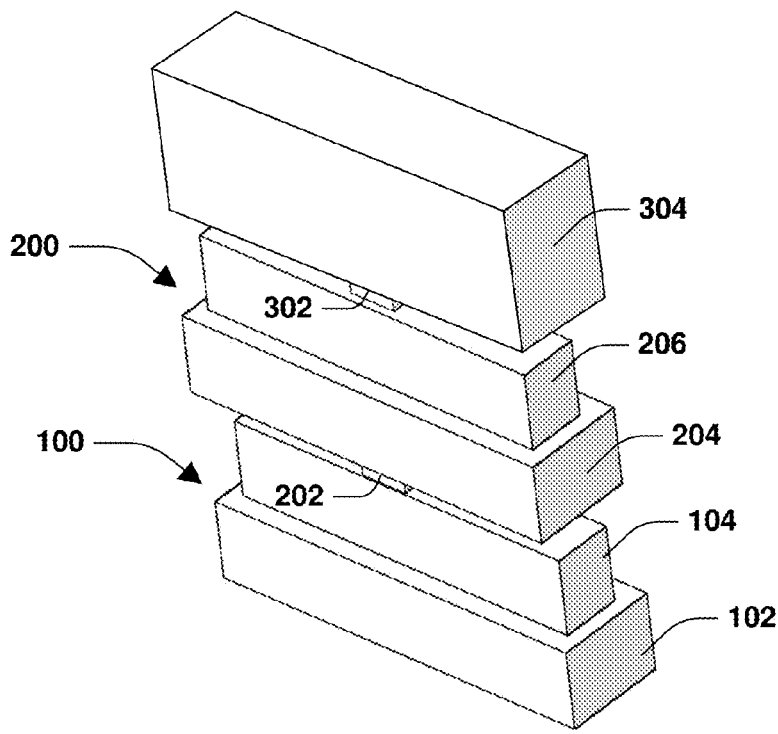
FIG. 5B is an illustration of a perspective view of a semiconductor structure comprising a first stacked interconnect structure, a second stacked interconnect structure, and an interconnect structure, according to some embodiments.

The second stacked interconnect structure 200 comprises the third interconnect structure 204 having a third aspect ratio, such as a third width 506. The second stacked interconnect structure 200 comprises the fourth interconnect structure 206 having a fourth aspect ratio, such as a fourth width 508. In some embodiments, the third aspect ratio is larger than the fourth aspect ratio, such as the third width 506 being larger than the fourth width 508, which mitigates defects, such as toppling, to improve yield. In some embodiments, the third interconnect structure 204 is formed to the third aspect ratio using a second mask and a third set of parameters, and the fourth interconnect structure 206 is formed to the fourth aspect ratio using the second mask and a fourth set of parameters different than the third set of parameters. The first stacked interconnect structure 100 is connected to the second stacked interconnect structure 200 by the via 202. The second stacked interconnect structure 200 is connected to the interconnect structure 304 by the via 302. FIG. 5B illustrates a perspective view of the first stacked interconnect structure 100, the second stacked interconnect structure 200, and the interconnect structure 304.

Figure 6A:
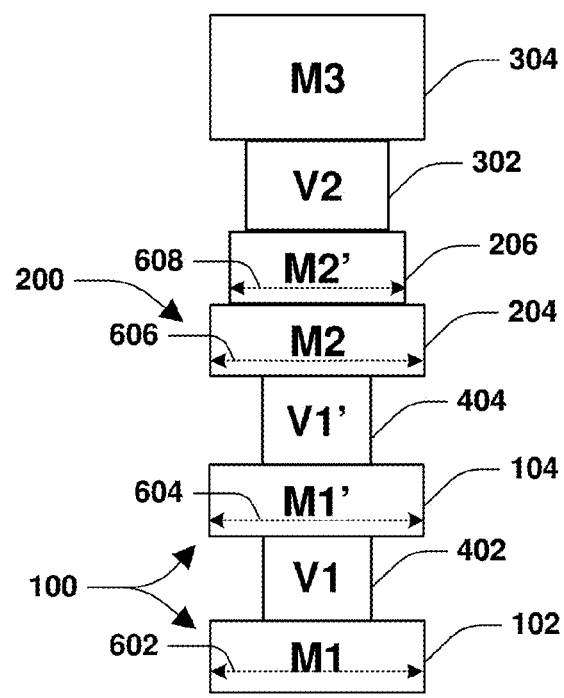
FIG. 6A is an illustration of a semiconductor structure comprising a first stacked interconnect structure, a second stacked interconnect structure, and an interconnect structure, according to some embodiments.

FIG. 6A illustrates a semiconductor arrangement comprising the first stacked interconnect structure 100, the second stacked interconnect structure 200, and the interconnect structure 304. The first stacked interconnect structure 100 comprises the first interconnect structure 102 having a first aspect ratio, such as a first width 602). The first stacked interconnect structure 100 comprises the second interconnect structure 104 having a second aspect ratio, such as a second width 604). In some embodiments, the first aspect ratio is substantially similar to the second aspect ratio, such as the first width 602 being substantially similar to the second width 604. In some embodiments, the first interconnect structure 102 is formed to the first aspect ratio using a first mask, and the second interconnect structure 104 is formed to the second aspect ratio using the first mask. In some embodiments, the first interconnect structure 102 is connected to the second interconnect structure 104 by the via 402.

Figure 6B:
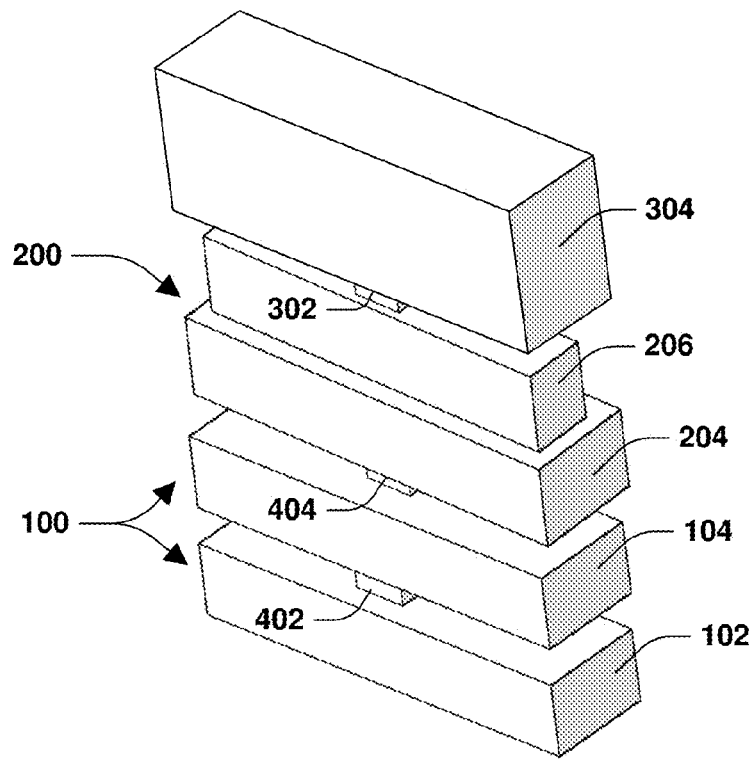
FIG. 6B is an illustration of a perspective view of a semiconductor structure comprising a first stacked interconnect structure, a second stacked interconnect structure, and an interconnect structure, according to some embodiments.

The second stacked interconnect structure 200 comprises the third interconnect structure 204 having a third aspect ratio, such as a third width 606. The second stacked interconnect structure 200 comprises the fourth interconnect structure 206 having a fourth aspect ratio, such as a fourth width 608. In some embodiments, the third aspect ratio is larger than the fourth aspect ratio, such as the third width 606 being larger than the fourth width 608, which mitigates defects, such as toppling, to improve yield. In some embodiments, the third interconnect structure 204 is formed to the third aspect ratio using a second mask and a third set of parameters, and the fourth interconnect structure 206 is formed to the fourth aspect ratio using the second mask and a fourth set of parameters different than the third set of parameters. The first stacked interconnect structure 100 is connected to the second stacked interconnect structure 200 by the via 404. The second stacked interconnect structure 200 is connected to the interconnect structure 304 by the via 302. FIG. 6B illustrates a perspective view of the first stacked interconnect structure 100, the second stacked interconnect structure 200, and the interconnect structure 304.

In this way, one or more stacked interconnect structures are formed within semiconductor arrangements to increase aspect ratios for interconnect structures, such as wires. The increased aspect ratio of the stacked interconnect structures reduces resistivity. Reducing resistivity increases performance of the semiconductor arrangements, such as speed of integrated circuitry. In some embodiments, a new tapeout database is generated based upon the one or more stacked interconnect structures.

Figure 7:
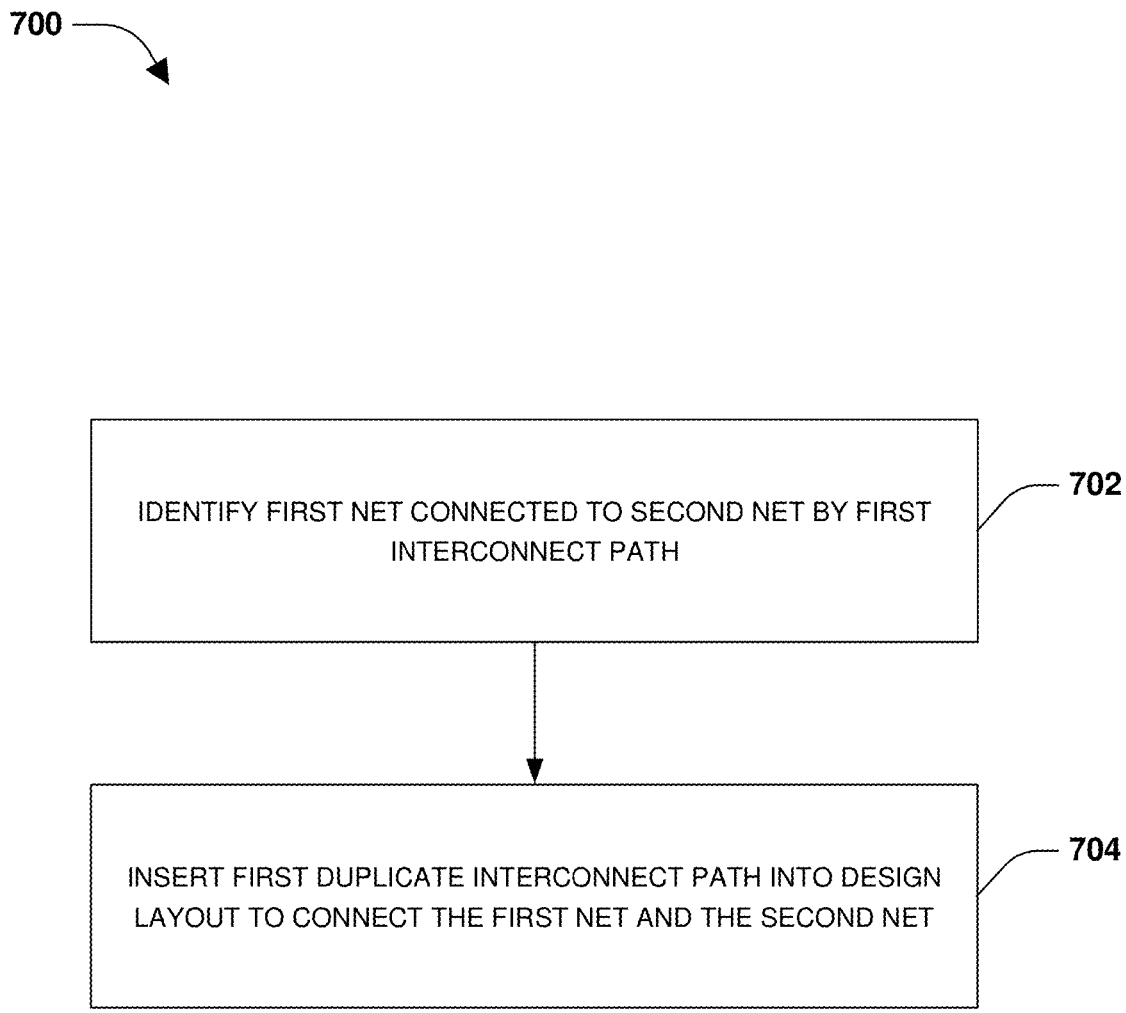
FIG. 7 is a flow diagram illustrating a method of routing nets within a design layout for a semiconductor arrangement, according to some embodiments.
Figure 8A:
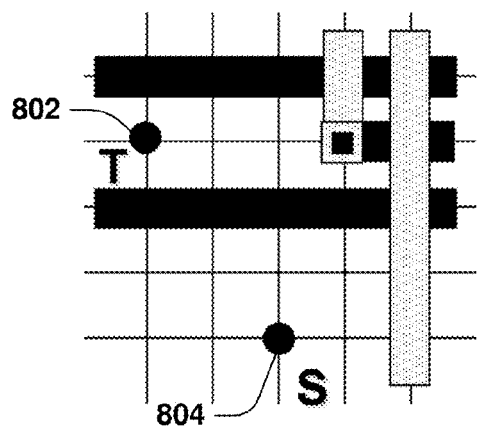
FIG. 8A is an illustration of a design layout comprising a first net and a second net, according to some embodiments.
Figure 8B:
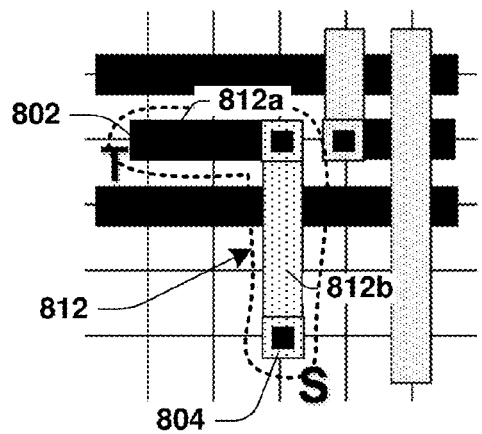
FIG. 8B is an illustration of a design layout comprising a first net and a second net connected by a first interconnect path, according to some embodiments.

A method 700 of routing nets within a design layout for a semiconductor arrangement is illustrated in FIG. 7. The design layout comprises a first net 802 and a second net 804, as illustrated in FIG. 8A. In some embodiments, the first net 802 and the second net 804 are associated with relatively high resistivity layers, such as a metal (1) layer or a metal (2) layer. At 702, the first net 802 is identified as being connected to the second net 804 by a first interconnect path 812 within the design layout, as illustrated in FIG. 8B. In some embodiments, the first net 802 is connected to a metal (1) layer portion 812a of the first interconnect path 812 by a first via. The metal (1) layer portion 812a is connected to a metal layer (2) portion 812b of the first interconnect path 812 by a second via. The metal layer (2) portion 812b of the first interconnect path 812 is connected to the second net 804 by a third via. In some embodiments, the first interconnect path 812 is evaluated to determine whether to insert one or more duplicated interconnect paths between the first net 802 and the second net 804 within the design layout. In some embodiments, a timing delay between the first net 802 and the second net 804 is evaluated against a timing delay threshold. In some embodiments, a temperature along the first interconnect path 812 is evaluated against a temperature threshold. In some embodiments, a current along the first interconnect path 812 is evaluated against a current threshold.

Figure 8C:
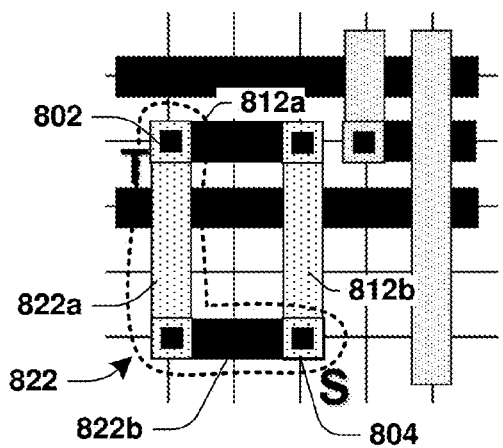
FIG. 8C is an illustration of a design layout comprising a first net and a second net connected by a first interconnect path and connected by a first duplicate interconnect path, according to some embodiments.

At 704, a first duplicate interconnect path 822 is inserted into the design layout to connect the first net 802 and the second net 804, as illustrated in FIG. 8C. In some embodiments the first net 802 is connected to a metal (2) layer portion 822a of the first duplicate interconnect path 822 by the fourth via. The metal (2) layer portion 822a is connected to a metal layer (1) portion 822b of the first duplicate interconnect path 822 by a fifth via. The metal layer (1) portion 822b of the first duplicate interconnect path 822 is connected to the second net 804 by the sixth via. The first interconnect path 812 and first duplicate interconnect path 822 have a combined resistivity that is smaller than a resistivity of the first interconnect path 812. Reducing the resistivity between the first net 802 and the second net 804 improves performance of the semiconductor arrangement. In some embodiments, the first duplicate interconnect path 822 is inserted into the design layout during a routing stage. In some embodiments, the first duplicate interconnect path 822 is inserted into the design layout during a post routing stage. In some embodiments, one or more additional duplicate interconnect paths are inserted into the design layout to achieve a desired resistivity between the first net 802 and the second net 804. In some embodiments, at least one of a revised circuit layout, a revised design layout, a revised design database, or a revised mask is generated based upon the one or more duplicate interconnect paths.

Figure 9:
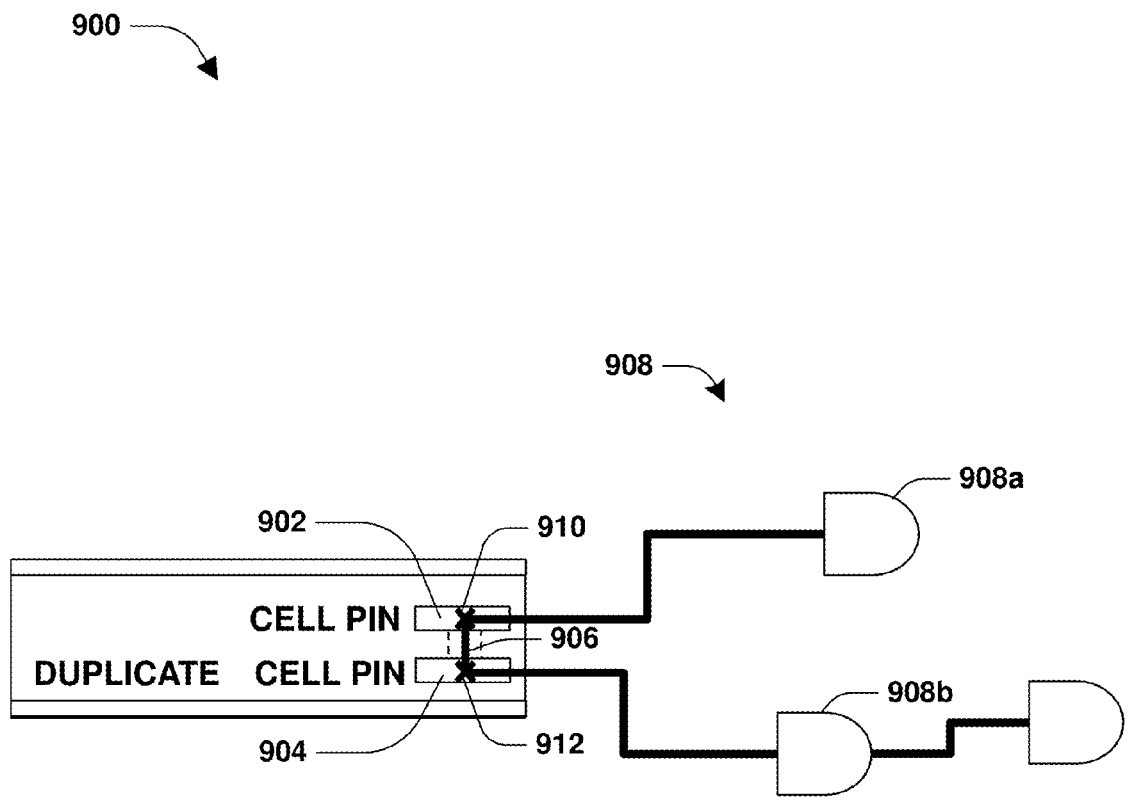
FIG. 9 is an illustration of semiconductor arrangement comprising one or more duplicate cell pins, according to some embodiments.

FIG. 9 illustrates a semiconductor arrangement 900 comprising one or more duplicate cell pins. The semiconductor arrangement 900 comprises a cell pin 902. The cell pin 902 is operatively coupled, such as through a first via 910, to a first portion of a logic structure 908, such as a first gate 908a. One or more duplicate cell pins are inserted into the semiconductor arrangement 900 to reduce resistivity associated with connecting the logic structure 908 to the cell pin 902. In some embodiments, a duplicate cell pin 904 is operatively coupled 906 to the cell pin 902 to form a cell pin node. The duplicate cell pin 902 is operatively coupled, such as through a second via 912, to a second portion of the logic structure 908, such as a second gate 908b. In this way, the logic structure 908 is connected to the cell pin node through the first via 910 and the second 912 to reduce resistivity. In some embodiments, the cell pin 902 and the duplicate cell pin 904 are formed within a first connectivity layer of the semiconductor structure. In some embodiments, a MUST JOIN pin property is used to connect the cell pin 902 to the duplicate cell pin 904. In some embodiments, the duplicate cell pin 902 is inserted into the semiconductor arrangement 900 during placement and routing of the semiconductor arrangement 900. In some embodiments, a connection between the cell pin 902 and the logic structure 908 is evaluated to determine whether to insert the one or more duplicate cell pins. In some embodiments, a timing delay between the cell pin 902 and the logic structure 908 is evaluated against a timing delay threshold. In some embodiments, a temperature along the connection between the cell pin 902 and the logic structure 908 is evaluated against a temperature threshold. In some embodiments, current along the connection between the cell pin 902 and the logic structure 908 is evaluated against a current threshold. In this way, one or more duplicate cell pins are inserted into the semiconductor arrangement 900 to reduce resistivity and improve performance of the semiconductor arrangement 900.

Figure 10:
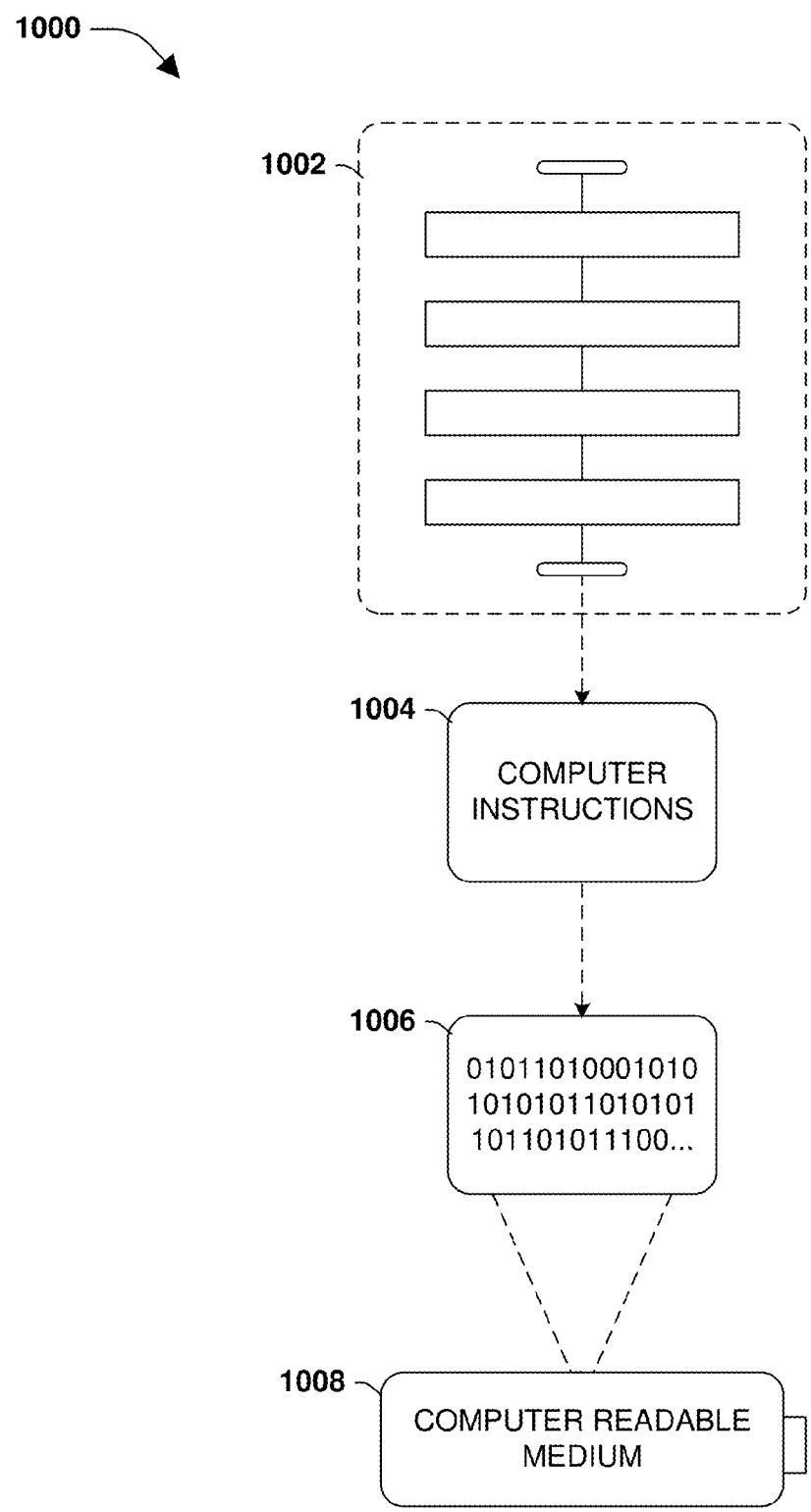
FIG. 10 is an illustration of an example computer-readable medium wherein processor-executable instructions configured to embody one or more of the provisions set forth herein may be comprised.

Still another embodiment involves a computer-readable medium comprising processor-executable instructions configured to implement one or more of the techniques presented herein. An exemplary computer-readable medium is illustrated in FIG. 10, wherein the implementation 1000 comprises a computer-readable medium 1008 (e.g., a CD-R, DVD-R, flash drive, a platter of a hard disk drive, etc.), on which is encoded computer-readable data 1006. This computer-readable data 1006 in turn comprises a set of computer instructions 1004 configured to operate according to one or more of the principles set forth herein. In an embodiment 1000, the processor-executable computer instructions 1004 are configured to perform a method 1002, such as at least some of the exemplary method 700 of FIG. 7. In an embodiment, the processor-executable instructions 1012 are configured to implement a system, such as a system for performing method 700. Many such computer-readable media may be devised by those of ordinary skill in the art that are configured to operate in accordance with the techniques presented herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing at least some the claims.

As used in this application, the terms "component," "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, many modifications may be made to this configuration without departing from the scope or spirit of the claimed subject matter.

Figure 11:
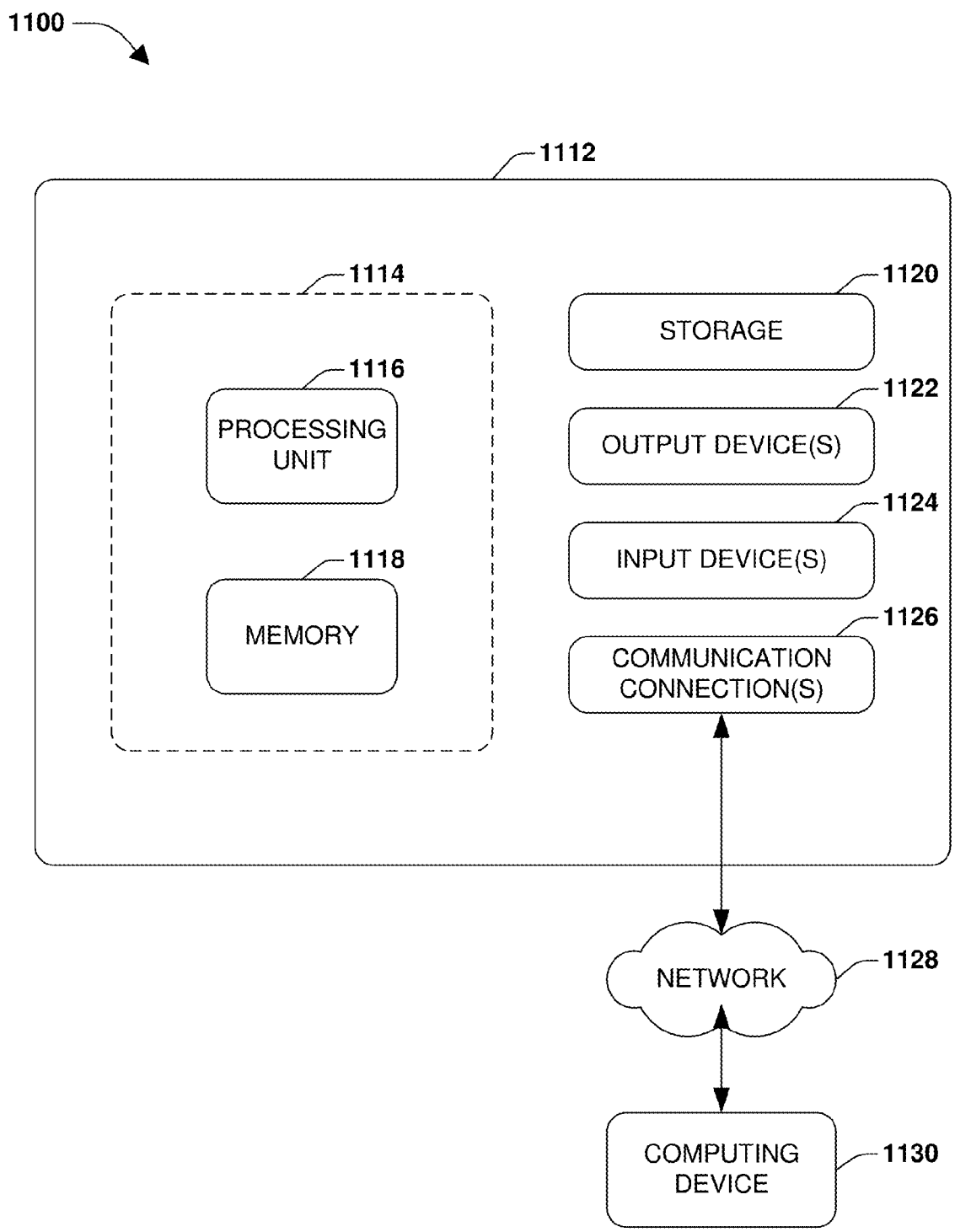
FIG. 11 illustrates an example computing environment wherein one or more of the provisions set forth herein may be implemented.

FIG. 11 and the following discussion provide a brief, general description of a suitable computing environment to implement embodiments of one or more of the provisions set forth herein. The operating environment of FIG. 11 is only one example of a suitable operating environment and is not intended to suggest any limitation as to the scope of use or functionality of the operating environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 11 illustrates an example of a system 1100 comprising a computing device 1112 configured to implement one or more embodiments provided herein. In one configuration, computing device 1112 includes at least one processing unit 1116 and memory 1118. Depending on the exact configuration and type of computing device, memory 1118 may be volatile (such as RAM, for example), non-volatile (such as ROM, flash memory, etc., for example) or some combination of the two. This configuration is illustrated in FIG. 11 by dashed line 1114.

In other embodiments, device 1112 may include additional features and/or functionality. For example, device 1112 may also include additional storage (e.g., removable and/or non-removable) including, but not limited to, magnetic storage, optical storage, and the like. Such additional storage is illustrated in FIG. 11 by storage 1120. In some embodiments, computer readable instructions to implement one or more embodiments provided herein may be in storage 1120. Storage 1120 may also store other computer readable instructions to implement an operating system, an application program, and the like. Computer readable instructions may be loaded in memory 1118 for execution by processing unit 1116, for example.

The term "computer readable media" as used herein includes computer storage media. Computer storage media includes volatile and nonvolatile, removable and non-removable media implemented in any method or technology for storage of information such as computer readable instructions or other data. Memory 1118 and storage 1120 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 1112. Any such computer storage media may be part of device 1112.

Device 1112 may also include communication connection(s) 1126 that allows device 1112 to communicate with other devices. Communication connection(s) 1126 may include, but is not limited to, a modem, a Network Interface Card (NIC), an integrated network interface, a radio frequency transmitter/receiver, an infrared port, a USB connection, or other interfaces for connecting computing device 1112 to other computing devices. Communication connection(s) 1126 may include a wired connection or a wireless connection. Communication connection(s) 1126 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

Device 1112 may include input device(s) 1124 such as keyboard, mouse, pen, voice input device, touch input device, infrared cameras, video input devices, and/or any other input device. Output device(s) 1122 such as one or more displays, speakers, printers, and/or any other output device may also be included in device 1112. Input device(s) 1124 and output device(s) 1122 may be connected to device 1112 via a wired connection, wireless connection, or any combination thereof. In some embodiments, an input device or an output device from another computing device may be used as input device(s) 1124 or output device(s) 1122 for computing device 1112.

Components of computing device 1112 may be connected by various interconnects, such as a bus. Such interconnects may include a Peripheral Component Interconnect (PCI), such as PCI Express, a Universal Serial Bus (USB), firewire (IEEE 1394), an optical bus structure, and the like. In another embodiment, components of computing device 1112 may be interconnected by a network. For example, memory 1118 may be comprised of multiple physical memory units located in different physical locations interconnected by a network.

Those skilled in the art will realize that storage devices utilized to store computer readable instructions may be distributed across a network. For example, a computing device 1130 accessible via a network 1128 may store computer readable instructions to implement one or more embodiments provided herein. Computing device 1112 may access computing device 1130 and download a part or all of the computer readable instructions for execution. Alternatively, computing device 1112 may download pieces of the computer readable instructions, as needed, or some instructions may be executed at computing device 1112 and some at computing device 1130.

According to an aspect of the instant disclosure, a semiconductor arrangement comprising a stacked interconnect structure is provided. The semiconductor arrangement comprises a first interconnect structure formed within a first lower layer of a first connectivity layer. The semiconductor arrangement comprises a second interconnect structure formed within a first upper layer of the first connectivity layer. The second interconnect structure is formed over the first interconnect structure such that the first stacked interconnect structure comprises the first interconnect structure and the second interconnect structure over the first interconnect structure.

According to an aspect of the instant disclosure, a method for routing nets within a design layout for a semiconductor arrangement is provided. The method comprises identifying a first net connected to a second net by a first interconnect path within the design layout. A first duplicate interconnect path is inserted into the design layout to connect the first net and the second net.

According to an aspect of the instant disclosure, a semiconductor arrangement comprising a duplicate cell pin is provided. The semiconductor arrangement comprises a cell pin operatively coupled to a first portion of a logic structure within a semiconductor structure. The semiconductor arrangement comprises a duplicate cell pin operatively coupled to a second portion of the logic structure. The duplicate cell pin is operatively coupled to the cell pin.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

Further, unless specified otherwise, "first," "second," and/or the like are not intended to imply a temporal aspect, a spatial aspect, an ordering, etc. Rather, such terms are merely used as identifiers, names, etc. for features, elements, items, etc. For example, a first object and a second object generally correspond to object A and object B or two different or two identical objects or the same object.

Moreover, "exemplary" is used herein to mean serving as an example, instance, illustration, etc., and not necessarily as advantageous. As used herein, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement comprising a stacked interconnect structure, comprising:
   a first interconnect structure formed within a first connectivity layer and having a first width;
   a second interconnect structure formed over the first interconnect structure and within the first connectivity layer, wherein:
   the second interconnect structure is in direct contact with the first interconnect structure, and the second interconnect structure has a second width that is less than the first width;
a third interconnect structure formed over the second interconnect structure and formed within a second connectivity layer, wherein the third interconnect structure has the first width;
a first via extending between the second interconnect structure and the third interconnect structure, wherein:
the first via has a third width between the second interconnect structure and the third interconnect structure, and
the third width is less than the second width;
a fourth interconnect structure formed over the third interconnect structure; and
a second via between the third interconnect structure and the fourth interconnect structure, wherein the second via has a fourth width that is less than the second width and greater than the third width.

2. The semiconductor arrangement of claim 1, wherein the first interconnect structure maintains the first width from a bottom surface of the first interconnect structure to a top surface of the first interconnect structure.

3. The semiconductor arrangement of claim 1, wherein the first via is in direct contact with the second interconnect structure and the third interconnect structure.

4. The semiconductor arrangement of claim 1, wherein the first interconnect structure and the second interconnect structure have a same height.

5. The semiconductor arrangement of claim 1, wherein the second interconnect structure has a second interconnect aspect ratio smaller than a first interconnect aspect ratio of the first interconnect structure.

6. The semiconductor arrangement of claim 1, wherein the fourth interconnect structure has a fourth interconnect aspect ratio different than a third interconnect aspect ratio of the third interconnect structure.

7. The semiconductor arrangement of claim 2, wherein the second interconnect structure maintains the second width from a bottom surface of the second interconnect structure to a top surface of the second interconnect structure.

8. The semiconductor arrangement of claim 7, wherein the third interconnect structure maintains the first width from a bottom surface of the third interconnect structure to a top surface of the third interconnect structure.

9. The semiconductor arrangement of claim 1, wherein the second via is in direct contact with the third interconnect structure and the fourth interconnect structure.

10. The semiconductor arrangement of claim 9, wherein the first via is in direct contact with the second interconnect structure and the third interconnect structure.

11. The semiconductor arrangement of claim 10, wherein the fourth interconnect structure has the first width.

12. The semiconductor arrangement of claim 9, wherein the fourth interconnect structure has the first width.

13. A semiconductor arrangement, comprising:
a first stacked interconnect structure, comprising:
a first interconnect structure formed within a first connectivity layer and having a first width; and
a second interconnect structure formed over the first interconnect structure and within the first connectivity layer, wherein:
the second interconnect structure is in direct contact with the first interconnect structure, and
the second interconnect structure has a second width different than the first width;
a second stacked interconnect structure formed over the first stacked interconnect structure and comprising:
a third interconnect structure formed within a second connectivity layer, wherein the third interconnect structure has the first width; and
a fourth interconnect structure formed over the third interconnect structure and within the second connectivity layer;
a first via in direct contact with the second interconnect structure and extending between the second interconnect structure and the third interconnect structure, wherein:
the first via has a third width between the second interconnect structure and the third interconnect structure, and
the third width is less than the second width;
a fifth interconnect structure formed within a third connectivity layer; and
a second via extending between the fourth interconnect structure and the fifth interconnect structure, wherein the second via has a fourth width that is less than the second width and greater than the third width.

14. The semiconductor arrangement of claim 13, wherein the second width is less than the first width.

15. The semiconductor arrangement of claim 13, wherein the fourth interconnect structure has the second width.

16. The semiconductor arrangement of claim 13, wherein the fourth interconnect structure has the first width.

17. The semiconductor arrangement of claim 13, wherein a height of the fifth interconnect structure is substantially equal to a combined height of the third interconnect structure and the fourth interconnect structure.

18. The semiconductor arrangement of claim 13, wherein the first interconnect structure maintains the first width from a bottom surface of the first interconnect structure to a top surface of the first interconnect structure.

19. The semiconductor arrangement of claim 13, wherein the first interconnect structure and the second interconnect structure have a same height.

20. A semiconductor arrangement, comprising:
a first stacked interconnect structure, comprising:
a first interconnect structure formed within a first connectivity layer and having a first width; and
a second interconnect structure formed over the first interconnect structure and within the first connectivity layer, wherein:
the second interconnect structure has a second width that is less than the first width,
the second interconnect structure is in direct contact with the first interconnect structure, and
the second interconnect structure maintains the second width from a bottom surface of the second interconnect structure to a top surface of the second interconnect structure;
a third interconnect structure over the second interconnect structure and having the first width;
a first via extending between the second interconnect structure and the third interconnect structure, wherein:
the first via is in direct contact with the second interconnect structure,
the first via has a third width between the second interconnect structure and the third interconnect structure, and
the third width is less than the second width;
a fourth interconnect structure formed over the third interconnect structure; and
a second via between the third interconnect structure and the fourth interconnect structure, wherein the second via has a fourth width that is less than the second width and greater than the third width.

* * * * *